United States Patent [19]

Eisenbrandt et al.

[11] Patent Number: 4,565,967
[45] Date of Patent: Jan. 21, 1986

[54] METHOD AND APPARATUS FOR TESTING MICROWAVE OVENS

[75] Inventors: Gerald A. Eisenbrandt, Lincoln Township, Berrien County, Mich.; James R. Marks, Perrysburg, Ohio

[73] Assignee: Whirlpool Corporation, Benton Harbor, Mich.

[21] Appl. No.: 390,788

[22] Filed: Jun. 21, 1982

[51] Int. Cl.⁴ .................... G01R 21/04; H05B 9/06
[52] U.S. Cl. ........................... 324/95; 219/10.85 D
[58] Field of Search ............................ 324/95, 106; 219/10.55 D

[56] References Cited

U.S. PATENT DOCUMENTS

| | | |
|---|---|---|
| 2,762,980 | 9/1956 | Kumpfer . |
| 3,576,494 | 4/1971 | Bahls et al. . |
| 3,789,299 | 1/1974 | Aslan ................................. 324/95 |
| 3,983,374 | 9/1976 | Sorensen, III et al. . |
| 4,125,763 | 11/1978 | Drabing et al. . |
| 4,201,987 | 5/1980 | Tricoles et al. . |
| 4,213,183 | 7/1980 | Barron et al. . |
| 4,354,153 | 10/1982 | Lentz .................................. 324/95 |

OTHER PUBLICATIONS

Appliance Manufacturer, 9/1982-"Automatic Scanner Speeds Microwave Testing".

Primary Examiner—Ernest F. Karlsen
Attorney, Agent, or Firm—Wood, Dalton, Phillips, Mason & Rowe

[57] ABSTRACT

A method and apparatus for testing microwave ovens to determine if exterior radiation levels exceed permissible maxima. The leakage levels are sensed by a sensor moved along a preselected path accurately spaced from the oven cabinet. The probe is moved automatically at high speed along the path until a leakage level above a preselected value is sensed. A control associated with the apparatus automatically causes the sensor to move subsequently at a reduced speed to determine the maximum leakage at that position. The control causes a repeated traverse of the questioned position at the slow speed to provide an accurate maximum leakage determination. The control includes reference information indicating acceptable levels of leakage along the path of movement of the sensor which are continuously compared with actual sensed values. Different factors are applied to the reference values correlated with the speed of movement of the sensor and the desired coarse or fine scanning accuracy to permit the selective, high speed movement of the sensor between all high leakage positions. Information concerning the location of the high leakage positions is provided at the end of the test to permit facilitated correction of any leakage problems found. The control may further include structure for tagging the device being tested and for other suitable disposition thereof, as desired. The apparatus in the illustrated embodiment includes a robot for automatically moving the sensor along the desired path and an associated control for effecting the desired high speed-low speed movement in providing the rapid determination of high leakage positions.

36 Claims, 10 Drawing Figures

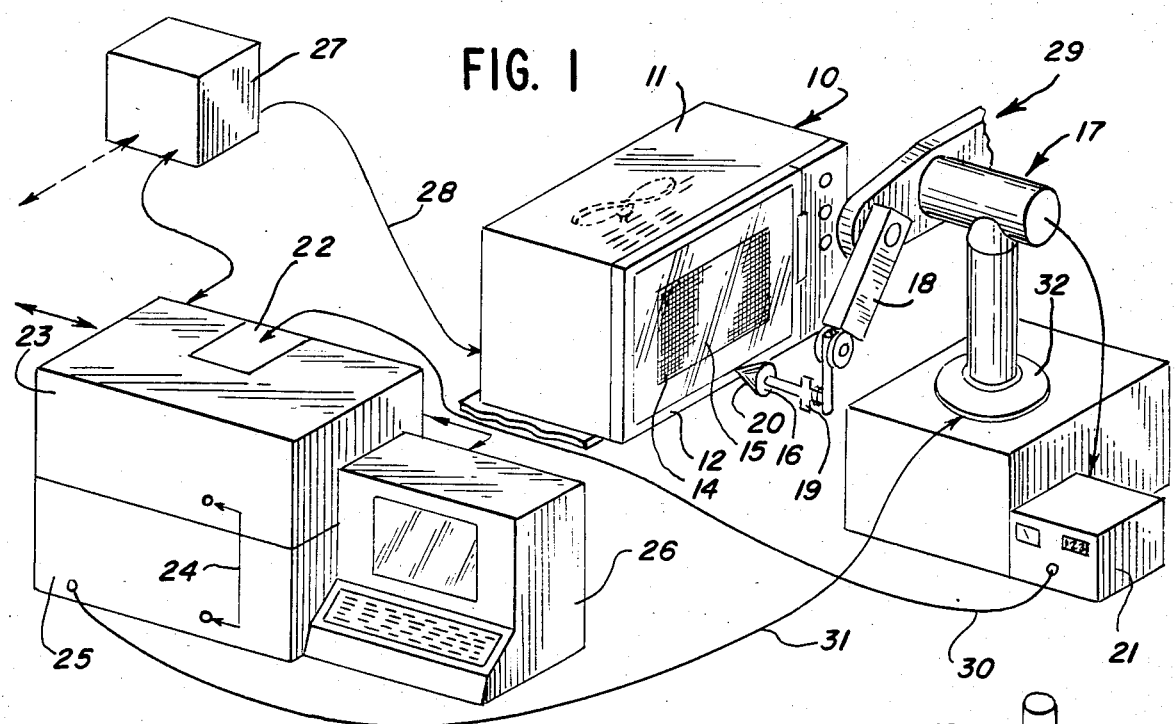
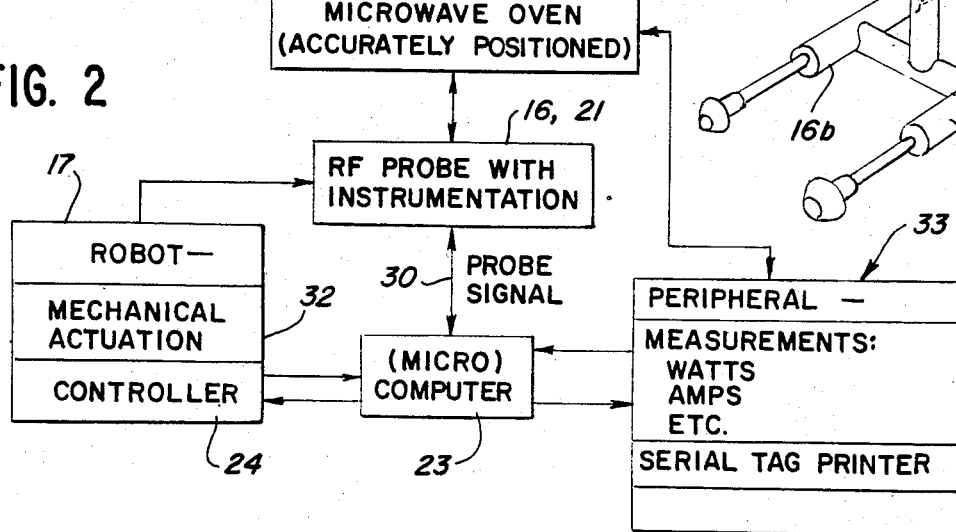
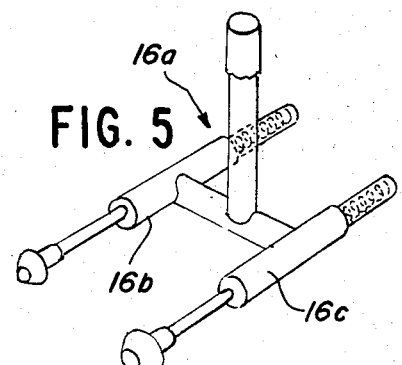
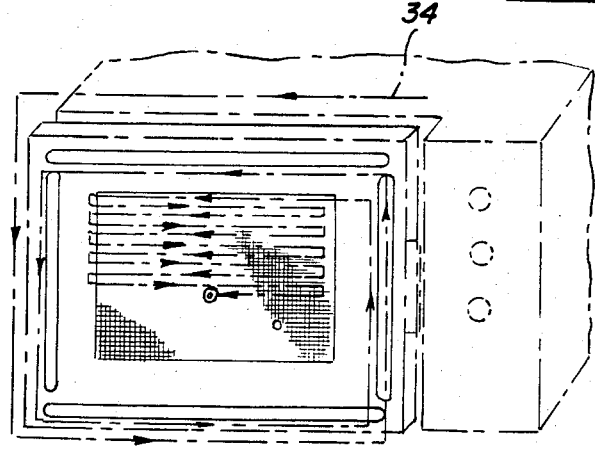

METHOD AND APPARATUS FOR TESTING MICROWAVE OVENS

BACKGROUND OF THE INVENTION

1. Field of the Invention

This invention relates to microwave ovens and in particular to methods and apparatus for testing microwave leakage from such microwave ovens in the manufacture thereof.

2. Description of the Prior Art

In U.S. Pat. No. 3,693,084, Carl F. Augustine discloses a method and apparatus for detecting microwave fields, such as the leakage of microwave energy around the doors and the like of microwave ovens. The patentee discloses a power density meter which includes a first microwave detector which records both microwave and infrared radiation, and a similar second detector recording only infrared radiation. By measuring the difference in color levels of the detectors, the infrared energy contribution is cancelled. More specifically, the patentee teaches the use of a first reflector positioned one-quarter of a wave-length from the first detector to cause all of the incident microwave energy to be dissipated in a resistive film. A second reflector is positioned one-half wave-length from the second detector such that all of the incident microwave energy is reflected and none is absorbed by the resistive film. A circuit is provided for balancing the color levels of both detectors to provide a quantitative measurement of the incident microwave energy.

In another embodiment, apparatus is provided for forming holograms of the microwave distribution. A camera or other imaging apparatus is positioned to record an interference pattern and provide a transparency thereof. The image of the object is reconstructed by illuminating the transparency with coherent light.

The detector utilizes liquid crystal temperature sensitive film means adjacent the resistive layer for transfer of thermal energy from the resistive layer to the liquid crystal sensitive film means to provide a visible display representative of the temperature distribution.

Bernard P. Gollomp discloses, in U.S. Pat. No. 3,812,334, a high speed measurement system which correlates high speed, low resolution measurements with low speed, high resolution measurements. The apparatus provides high speed measurement of analog input signals and converts the analog input signals to a digital format at precise increments. The apparatus utilizes input signal ranging capabilities in effecting the desired correlation.

Steven H. Garrett discloses, in U.S. Pat. No. 4,229,796, a programmed controller for ultrasonic testing of turbine rotors and the like. The apparatus includes a programmed microprocessor based electronic controller adaptively coordinating the ultrasonic testing operations of an ultrasonic tester and associated drive unit and a selective one of a plurality of control modes wherein each control mode is conducted in accordance with observable test data and anomaly indications generated from the ultrasonic tester and drive unit during the testing operations.

SUMMARY OF THE INVENTION

The present invention comprehends an improved method and apparatus for determining microwave leakage characteristics of a microwave oven for use in quality control of the manufacture thereof.

Standards for permitted microwave radiation leakage from microwave ovens and the like have been established. In the manufacture of the oven, it is desirable to determine the leakage at different points where such leakage may occur and to remedy any defects permitting localized high leakage conditions.

It has been conventional in the manufacture of such microwave ovens for an operator of the test equipment associated with the manufacturing operation to scan the surface of the microwave oven with a suitable probe, such as well-known radio frequency probes manufactured by Holaday Industries, Narda or Simpson. The standards require a determination of the leakage measurement by holding the probe stationary for a period of time lasting as long as one complete revolution of any microwave mode stirrer provided within the oven as the possible leakage may vary with the disposition of the stirrer.

To locate the different points of maximum leakage, the operator monitors the leakage while moving the probe perpendicular to and along the surface of the oven along a desired path. In moving the probe, the measurement made thereby may deteriorate as a result of the interaction of the velocity of the probe, the time response of the probe in an associated measurement circuitry, and the time variation caused by the stirrer in the oven cavity. Thus, it is necessary to adjust the readings in accordance with the velocity of the probe as it is moved along the oven surface. Such use of the probe could require a continuous mental computation on the part of the operator and such a continuous computation is probably beyond the capabilities of the average operator. To avoid the need for such mental computation, the operator normally moves the probe at a relatively slow velocity, such as 1 per second or less, thereby requiring relatively long testing time resulting in high expense.

The present invention provides a method and apparatus for determining the microwave leakage of such an oven which eliminates the problems of such operator manual testing and provides a high speed, low cost, accurate determination of the leakage characteristics of apparatuses, such as microwave ovens.

The present invention comprehends providing a probe-moving device, such as a conventional robot, with a spring-loaded probe or sensor, and controlling the operation of the robot with a microcomputer to provide automatic compensation of leakage measurements accounting for the probe motion. The control automatically adjusts the speed of the probe movement for improved accuracy in the measurement of the microwave radiation leakage.

The mechanical actuator robot provides multiplanar articulation so as to move the probe along different oven surfaces in determining the leakage characteristics.

The computer automatically compensates for inaccuracies introduced by the rapidly moving probe, such as resulting from the probe velocity, the time response of the control, the leakage pattern, and the stirrer variation interactions.

The signal produced by the probe is determined by an analog to digital conversion in the computer. This signal is then effectively multiplied by a correction factor determined by prior computation by the reduction of peak signal resulting from a given probe velocity and probe instrument time response, with the worst condition assumed for the leakage pattern and stirrer variations.

The invention comprehends that the probe be moved along a preselected path adjacent the oven being tested at a relatively high speed until such time as the sensed leakage increases to a preselected first value. The control then causes the probe speed to be reduced and the probe to have a repeated traverse of the position to determine accurately the maximum leakage condition thereat.

The invention comprehends establishing preselected leakage reference values to effect the automatic control of the probe speed. The reference values are determined by a number of factors, including factors related to the speed of the probe in each of the high speed and reduced speed modes. Another of the factors is determined by the desired coarse or fine scan characteristics providing increased accuracy in the low speed, fine scan mode.

Thus, the invention comprehends providing implementation of the system wherein the correction factors are applied by selectively adjusting the levels of the references.

The invention comprehends providing a readout of the maximum scan leakages for facilitated determination of the positions along the sensor movement path of the maximum leakage conditions.

The invention comprehends that the control microcomputer also serve as a means for controlling the overall testing operation, including control of peripheral equipment for issuing serial tags, and directing disposition of the tested oven following the test.

The improved control provides automatic compensation for the different factors normally degrading the readings effected by such sensor probes and, thus, allows the probe velocity to be maintained at a high speed other than at the determined points of increased radiation leakage, thereby reducing the time required for, and thus the cost of the testing and providing improved accuracy in the testing.

The movement of the probe by the robot may be preprogrammed so as to provide accurate checking of all desired points of the oven cabinet wherein leakage may occur.

The use of the control eliminates the subjectivity of an operator and provides a positive determination of any high leakage conditions in the microwave oven being tested.

The invention comprehends the testing of such microwave ovens with a probe high speed rate of approximately 4 in./sec., which is approximately four times the speed rate of the conventional method, while automatically adjusting the error limits according to the speed based on theoretical analyses. The high speed is effectively maintained constant during all portions of the probing operation other than when the sensor determines a rise in the sensed leakage above a preselected reference level.

The robot may be provided with a suitable compliant probe holder and means for maintaining the probe accurately at a spacing of 5 cm. from the surface being tested, in accordance with the standards.

A single probe may be used, or two or more probes may be used together, if desired, to simultaneously sense leakage at two or more points along the sensor movement path for increased speed in the testing operation.

The method and apparatus for testing microwave oven leakage of the present invention is extremely simple and economical while yet providing the highly desirable repeatable accuracy in such testing.

BRIEF DESCRIPTION OF THE DRAWING

Other features and advantages of the invention will be apparent from the following description taken in connection with the accompanying drawing wherein:

FIG. 1 is a schematic perspective view of an apparatus embodying the invention for use in testing the leakage of microwave energy from a microwave oven being tested;

FIG. 2 is a schematic block diagram illustrating the functional relationship of the components of the test system of FIG. 1;

FIG. 3 is a fragmentary perspective view illustrating a test path utilized in performing a testing of a microwave oven by the method and apparatus of the invention;

FIG. 5 is a fragmentary perspective view of a sensor employing multiple probes.

DESCRIPTION OF THE PREFERRED EMBODIMENT

Figure 4:
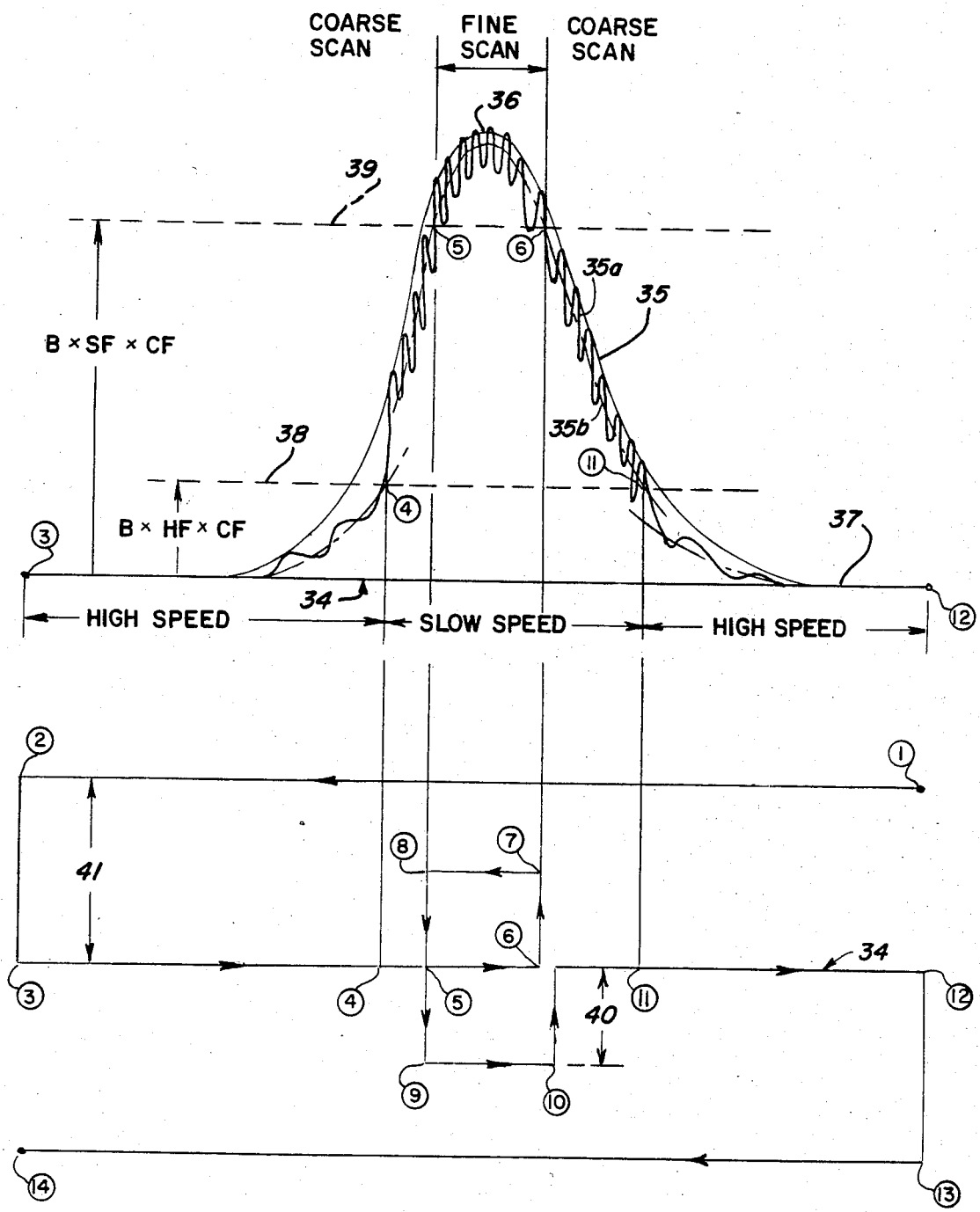
FIG. 4 is a diagram illustrating operating conditions of the apparatus at a position of maximum microwave radiation leakage along the test path.

In the illustrative embodiment of the invention as disclosed in the drawing, a conventional microwave oven 10 to be tested includes an outer cabinet 11 having a hingedly mounted door 12 selectively closing the oven cavity, which may be provided with a conventional microwave mode stirrer 13. The door is provided with a conventional window 14 permitting observation of the material being heated in the oven. The window is provided with a foraminous screen 15 which effectively prevents microwave leakage outwardly therethrough while yet permitting the desirable inspection of the oven cavity.

It has been found that microwave leakage may occur along the edge of the door 12, along the edge of window 14 and through openings in the screen 15. It has been conventional, as indicated above, to determine the leakage of the microwave radiation at these areas by an operator moving a probe slowly adjacent thereto. As discussed above, it is highly desirable to eliminate the problems attendant such manual testing. The present invention is concerned with the provision of a method and apparatus for effecting such testing automatically and at high speed, while yet providing highly accurate determinations of the leakage conditions of the tested oven.

The invention comprehends method and apparatus for moving a sensor probe 16 adjacent the microwave oven by means of a robot 17 having an articulated arm 18. The arm includes a compliant hand element 19 carrying the probe for spring-biasing a somewhat cone-shaped spacer 20 at the outer end of the probe against the surface of the oven to accurately space the probe 5 cm. or less from the surface in making the microwave radiation leakage determinations. An excellent example of such a robot is the PUMA 600 robot manufactured by Unimation, Inc. Illustratively, the sensor probe 16, in the illustrated embodiment, comprises an HI-1700 RF measurement probe manufactured by Holaday Industries.

The robot includes associated instrumentation 21 which is connected to an analog-to-digital converter 22 of a microcomputer 23 functioning as a signal processor/adaptive scan controller. One example of such a conventional microcomputer which has provided good results in using the present invention is a suitably configured Texas Instruments Incorporated TM 990 microcomputer.

In FIG. 5 there is shown a sensor probe 16a employing multiple spaced apart probes 16b and 16c, which may be used together, where advantageous, with structure generally the same as shown in FIG. 1, to simultaneously sense leakage at two different spaced apart points along the sensor movement path for increased speed in the testing operation. The probes 16b and 16c are carried by compliant hand elements corresponding to the hand element 19 shown in FIG. 1. The sensed probe signals from the probes 16b and 16a are combined in the probe circuitry and instrumentation. Each probe requires separate probe instrumentation corresponding to instrumentation 21 with the respective probe signals being transmitted through an analog-to-digital converter similar to converter 22 but with multiplexing capability to a controller, not shown, generally similar to controller 23. Although two probes are shown in FIG. 5, even more probes may be used if desirable and advantageous. Those skilled in the art will appreciate that multiple probes may be used and the invention is not limited to the single probe arrangement of FIG. 1 or the dual probe arrangement of FIG. 5.

As shown in FIG. 1, an adaptive scan control signal 24 is provided from microcomputer 23 to a robotics control 25 which, in turn, provides a control signal to the robot mechanism 17.

An input terminal 26, of conventional construction, is connected to the microcomputer 23. A host computer may be utilized (not shown) to provide further control of microcomputer 23. Additionally, a data/start control 27 is provided for providing information to the microcomputer or controller 23 as to the watts/amps, ground integrity, and serial number information concerning the microwave oven being tested. Control 27 provides power to the microwave oven being tested through a power line 28, as indicated in FIG. 1.

The functioning of the apparatus generally designated 29 described above for use in testing the microwave radiation leakage of the oven 10 is illustrated schematically in FIG. 2. Thus, as shown therein, the oven 10 is associated with the sensor probe 16 and instrumentation 21 so as to provide a probe signal 30 to the controller 23 through the analog-to-digital converter 22 thereof.

A signal is provided from the microcomputer 23 to the control 25, which provides a signal 31 to the mechanical actuating means 32 of robot 17 for controlling the robot.

As further illustrated in FIG. 2, the invention comprehends the inclusion of peripheral apparatus generally designated 33 for providing information to the microcomputer, such as the wattage, amperage, etc., and for receiving information from the computer such as for use in providing information to a serial tag printer of the apparatus 33.

As indicated briefly above, it has been found that in order to comply with the present standards such as promulgated under HEW Publication FDA 79-8035, §103.1, a determination of radiation leakage about the edge of the door 12, the edge of the window 14, and across the area of the screen 15 provides necessary determinations. Thus, a path 34 traversing these portions of the microwave oven, as illustrated in FIG. 3, will permit the sensor probe to determine the radiation leakage of the oven to determine compliance with these standards. Thus, the robot 17 is programmed to move the sensor probe 16 along path 34 automatically with the probe being spaced accurately 5 cm. or less from the oven surface at all times. The compliant hand support 19 may be arranged to cooperate with the spacer 20 in assuring the accurate spacing of the sensor probe from the oven surface at all portions of the path 34 in the test operation.

Microcomputer 23 is programmed suitably to provide a novel method of leakage determination in the traversal of the path 34 by the probe. The computer 23 functions as a portion of the measurement system in accounting for inaccuracies introduced into the testing operation as a result of the probe velocity, the time response thereof, the leakage pattern of the oven, and the stirrer variation interactions. More specifically, the signal which is processed by the probe instrumentation 21 so as to provide an average signal is read by the computer through the analog-to-digital conversion effected by converter 22. The computer then effectively provides a correction factor in determining the compliance of the leakage with the reference standard. The correction factor is determined by prior computation of the reduction of peak signal sensed by the probe caused by the given probe velocity and probe instrument time response with a worse condition assumed for the leakage pattern and stirrer variations.

In carrying out the test operation, the probe is moved by the robot 17 along the path 34 at a relatively high speed of approximately 4 in./sec. until the probe senses an increase in the leakage to a preselected value. This is approximately four times the speed utilized in conventional manual movement of the probe. Referring to FIG. 4, one portion of the path 34 traversed by the probe is illustrated wherein a high leakage condition occurs. Thus, as illustrated in FIG. 4, the probe is moving at high speed at point 3 to the right toward point 12. At a position intermediate point 3 and a subsequent point 4, the leakage condition represented by curve 35 begins to increase as the probe approaches a position of maximum leakage Curve 35 represents the average leakage condition as it would be measured with a nonmoving probe, while somewhat jagged curve 35a represents the measured leakage condition with the stirrer moving, and curve 35b represents the measured leakage with no stirrer movement.

As illustrated in FIG. 4, the sensed leakage increases to a maximum value 36 and then decreases to the normal value 37 as the probe approaches position 12.

As discussed above, if the probe were permitted to continue at high speed past the position of maximum leakage 36, inaccuracies in the determination of the position and value of the maximum leakage would occur because of the errors introduced into the probing system. However, it must be recognized that some variations in the leakage level may be present along the path 34 which are not out of limit. When, however, the sensed leakage rises to a first preselected elevated value 38, the computer provides a signal to the robotics control unit 25 causing the speed of the probe to be reduced so as to permit a low speed traverse of a portion of the path in order to obtain a highly accurate leakage determination at that location.

In addition, as illustrated in FIG. 4, movement of the probe along the path 34 which includes the segment scans between point 3 and point 12, is altered so as to retraverse the position wherein the maximum leakage 36 occurs. In FIG. 4 this maximum leakage 36 is well below the reject level valve 9. The location of the retraversal portion of the path movement is determined by the rising of the leakage to a value 39. As shown in FIG. 4, during the portion of the probe movement from point 5 where the measured radiation leakage reaches value 39 to the point 6 where the measured radiation drops back to that value, the probe movement is caused to define a fine scan pattern having a scan spacing 40 approximately one-half the coarse scan spacing 41 of the probe path scans where the probe is moving at normal high speed such as between points 2 and 3.

Further, more specifically, as shown in FIG. 4, the low speed movement of the probe between points 4 and 11 is further caused to provide a fine scan spacing retraversal of the portion of the path between points 5 and 6. In doing so, the probe defines a first reversed scan portion between points 7 and 8 having a spacing from the path of movement of the probe between points 5 and 6 approximately one-half of the spacing between points 2 and 3.

From point 8 at the lefthand end of the rearward traversal movement, the probe is moved to point 9 spaced from the half portion between points 4 and 5 the distance 40 and then caused to traverse the path between points 9 and 10 and back to point 6 before continuing on the original scan path to point 11 and thence on to point 12.

During the fine scan, low speed movement of the probe effected between points 5, 6, 7, 8, 9, 10, 6, a highly accurate determination of the radiation leakage is obtained by the probe instrumentation so as to provide an accurate readout as on the input device 26 subsequently as desired.

If less accuracy is required, those skilled in the art will recognize that portions of the probe movement steps can be omitted.

The levels 38 and 39 are determined so as to assure accurate measurement of values of maximum radiation leakage.

Level 38 has a value of B×HF×CF. Level 39 has a value of B×SF×CF and the radiation leakage measurement is considered to have exceeded the desired maximum value when it has a value greater than B×SF×FF the value of reject level 9 where B=Base Limit=X×(1−rf measurement instrument error); HF=High Speed Factor; SF=Slow Speed Factor where HF and SF are (1-maximum measurement error fraction) as resulting from the instrumentation time response or filtering per theoretical computation for fast or slow instrumentation field probe speed past the potential narrowest beam leakage radiation pattern generated by a given design microwave oven including variation such as generated by a microwave mode, i.e. load stirrer; and CF= Coarse Segment Factor and FF=Fine Segment Factor where CF and FF are (1-maximum measurement error fraction) which could result from peak leakage along a specific scan being less than the true maximum were it to be located somewhere between scans as theoretically computed for different distances between such scans for potential leakage radiation patterns for a given microwave oven design.

Typical values for the parameters X, B, HF, SF, CF and FF for a scan spacing 40 of $\frac{1}{4}$ inch, a scan spacing 41 of $\frac{1}{2}$ inch, a slow speed of 1 in./sec., and a high speed of 4 in./sec. are as follows:

X = 1 milliwatt/cm$^2$
B = 0.85 for 15% instrumentation error
HF = 0.30
SF = 0.95
CF = 0.90
FF = 0.98

In practice, when the limit 38 is reached at point 4, the probe movement is stopped, and possibly reversed some arbitrary distance to assure point 5 is reached before point 36 to allow for the measurement instrument response to catch up with the probe and then the probe is moved at slow speed between points 4, 5, 6, 7, 8, 9, 10, 6, as discussed above. When the limit 39 is exceeded at point 5, the control causes the scan to proceed as a fine scan continuing the slow speed movement. The end of the fine scan region is located at point 6 when the probe returns thereto after passing point 10, which is the point at which the curve returns to point 11 at level 38. However, in practice, the end of the fine scan region may be somewhat below level 38 for stable behavior with normal signal variation as indicated by jagged curve 35a. Thus, a fine scan is made about the region of the maximum leakage 36 to provide the desired high accuracy determination and the probe is then automatically restored to the high speed operation after being moved to point 11 where the leakage drops below the level 38.

By reducing the speed of the probe at the position of the maximum leakage 36 and utilizing the fine scan pattern illustrated in FIG. 4 at this position, the error in measuring the maximum value may be made to approach that of the measuring instrument itself while yet permitting a total minimum test time to be required in testing the microwave oven. Illustratively, it has been found that with this method of determining the microwave leakage, an accuracy within ±1 db may be readily obtained. Further, as no human error is involved as the entire testing operation is automatically controlled by the microcomputer and robot, highly repeatable accurate determinations of a plurality of such microwave ovens as in normal manufacturing operations may be effected at relatively high speed and low costs. Use of the present invention in testing during the manufacture of microwave ovens has demonstrated that the required testing can be accomplished with improved accuracy in only about one fourth the time required for testing using conventional methods and apparatus.

Figure 6:
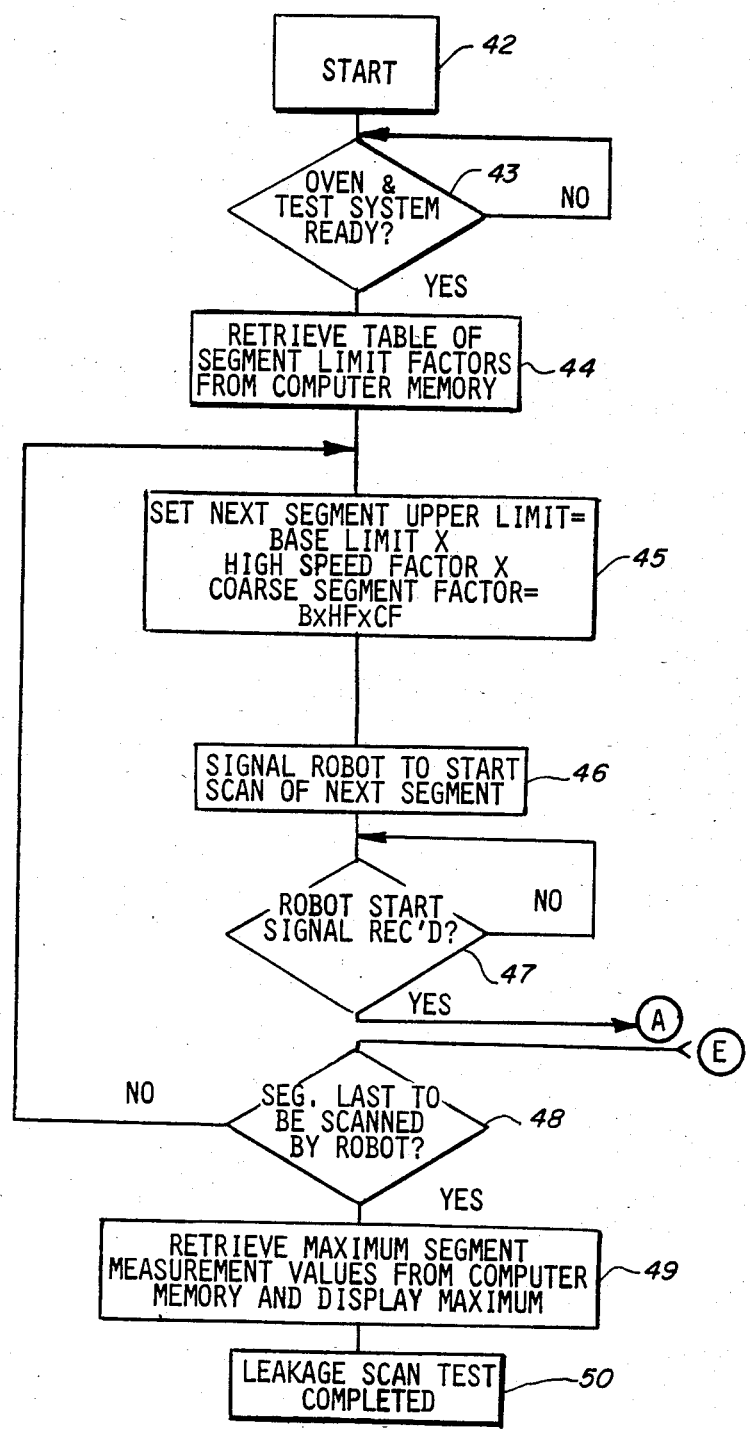
FIGS. 6-10 are flow charts illustrating the steps of operation of the control system illustrated in FIG. 1 in carrying out the determination of microwave radiation leakage from a microwave oven being tested.

The specific operation of the testing apparatus 29 is illustrated in block form in the flow charts shown in FIGS. 6-10. The Executive Program flow chart of FIG. 6 indicates the overall method and operation of apparatus 29. As shown therein, the test procedure is initiated by the user pressing a start button on the input terminal 26. The control waits at decisional block 43 to determine whether the oven and test system is ready. If so, as indicated in FIG. 6, the computer retrieves the table of segment limit factors from its memory, as illustrated in block 44.

In block 45, the computer sets the next segment upper limit which, as discussed above, is B×HF×CF, as indicated in block 45.

Next, as indicated in block 46, the computer signals the robot to start the scan of the next segment.

The decisional block 47 then causes the program to exit at A when the robot start signal is received.

Upon scanning of the last signal of each scan by the robot, decisional block 48 causes the computer to retrieve the maximum segment measurement values from the computer memory and to display these maximum values, as indicated in block 49. In the event the segment scan is not the last segment to be scanned by the robot, the program is returned to set the next segment upper limit at block 45 and the sequence repeated until the program reaches the last segment to be scanned at block 48.

As indicated at block 50, upon display of the maximum values, the leakage scan test is completed.

Figure 7:
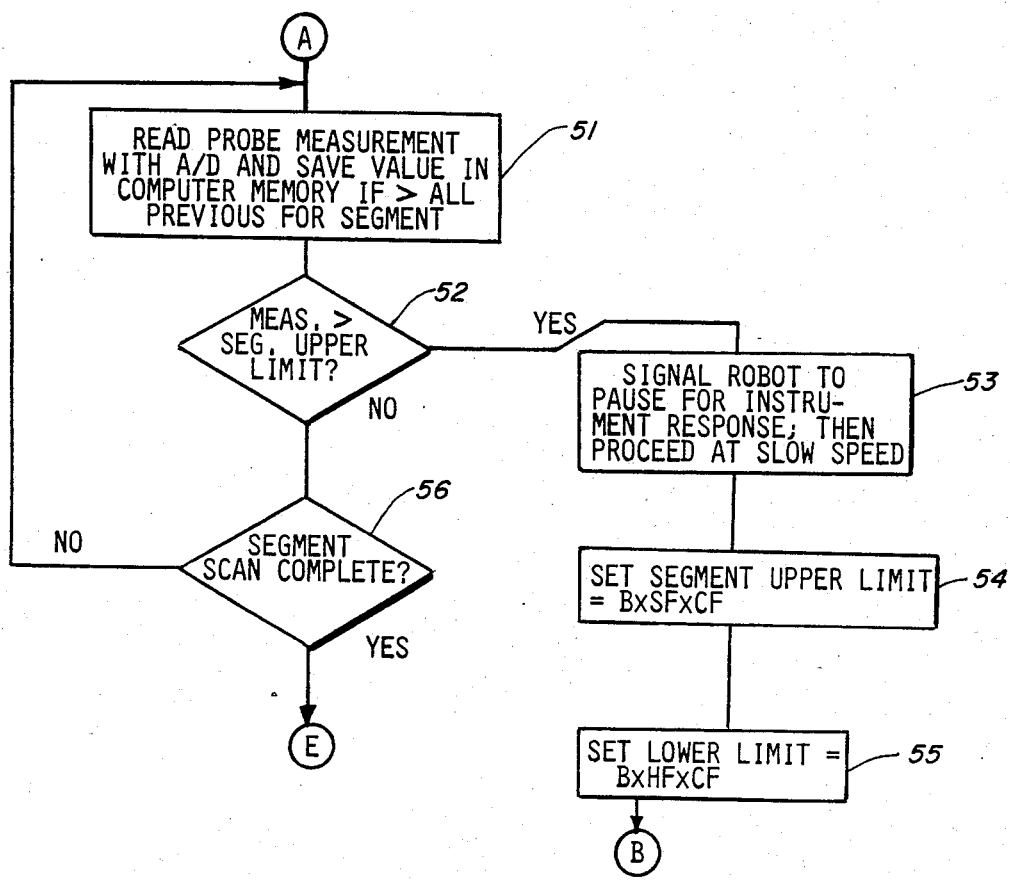

Referring now to the flow chart of FIG. 7, the program enters the subroutine thereof at A to start the sensing program execution at block 51, with the analog-to-digital converter reading the probe measurement and the computer saving the value in the computer memory which is greater than all previous values for that segment.

The program continues at decisional block 52 such that if the measured value of the leakage is greater than the segment upper limit, the program continues to block 53 wherein the robot is signaled to pause for instrument response and then proceed at slow speed. In continuing the movement at slow speed, the computer sets the segment upper limit to equal $B \times SF \times CF$ at block 54 and sets the lower limit to equal $B \times HF \times CF$ at block 55, with the program then going to point B.

If the measurement is not greater than the segment upper limit at decisional block 52, the program continues to decisional block 53 where determination is made as to whether the segment scan is complete. If it is, the program continues to point E, and if not, the program returns to point A for a repeated determination of the probe measurement readings.

Figure 8:
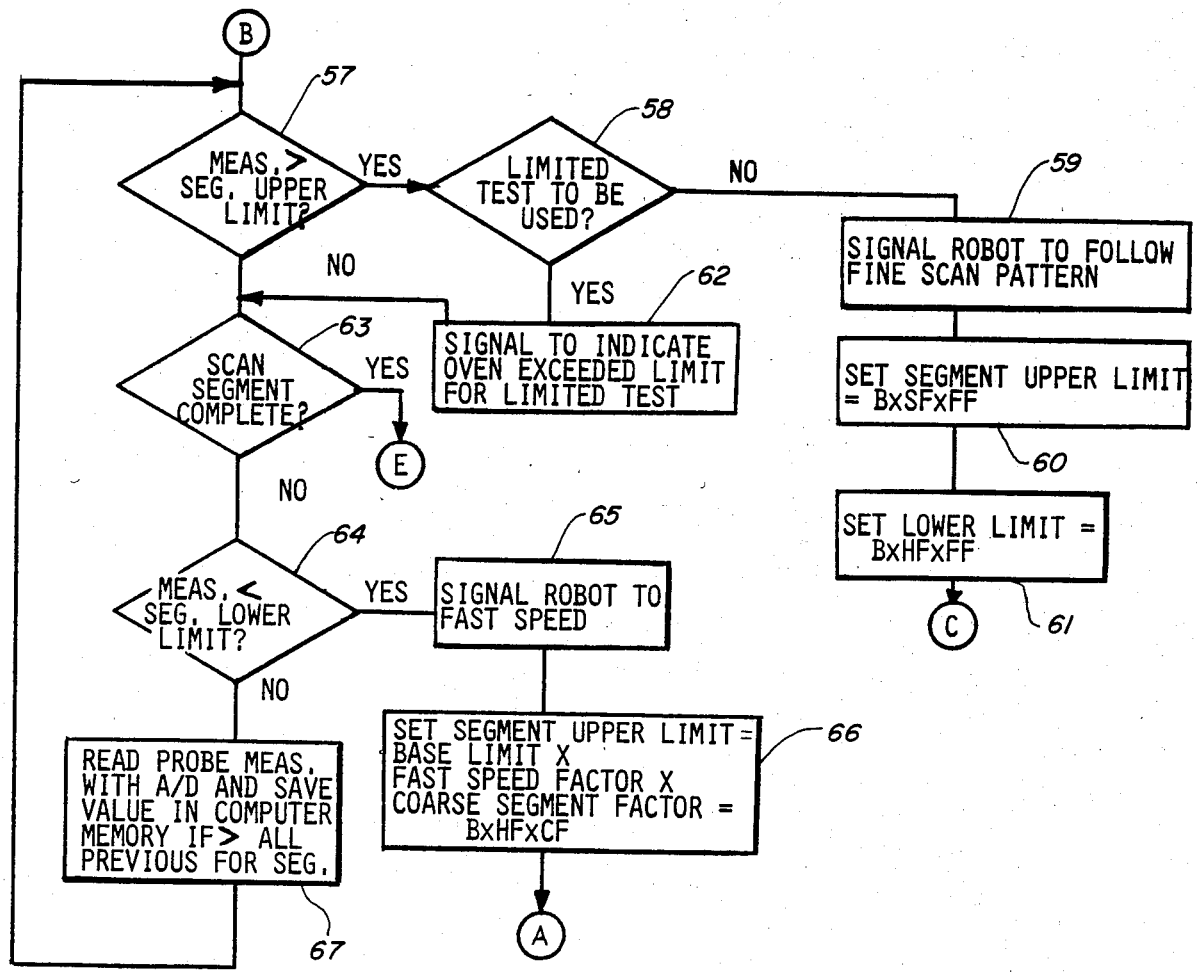

Referring now to the flow chart of FIG. 8, where the program enters at point B, the program continues to decisional block 57 where a determination is made as to whether the measurement is greater than the segment upper limit. If so, the program continues to decisional block 58 where determination is made as to whether a limited test is to be used. If it is determined not to use a limited test, the program continues to block 59 wherein a signal is provided to the robot to follow the fine scan pattern, with the upper limit of the segment set at $B \times SF \times FF$ in block 60. A lower limit has been set in block 61 at $B \times HF \times FF$ and the program exits to point C.

Returning to decisional block 58, if the limited test is to be used, the program continues to block 62 wherein a signal to indicate the oven exceeded the limit for the limited test is provided to the decisional block 63 wherein a determination as whether the scan segment is complete. If so, the program exits to point E, and if not, the program continues to decisional block 64 where a determination as to whether the measurement is less than the segment lower limit. If it is, the program continues to block 65 wherein a signal is provided to the robot to return to fast speed. The program then continues to block 66 wherein the controller sets the segment upper limit at $B \times HF \times CF$ and then the program exits to point A again.

Alternatively, if the measurement provided from decisional block 63 is not less than the segment lower limit, the program continues to block 67 wherein the probe measurement is read with the analog-to-digital converter and the value thereof saved in the computer memory if that value is greater than all previous measurements for that segment. The program is then returned to point B for a repetition of the above-discussed subroutine.

Figure 9:
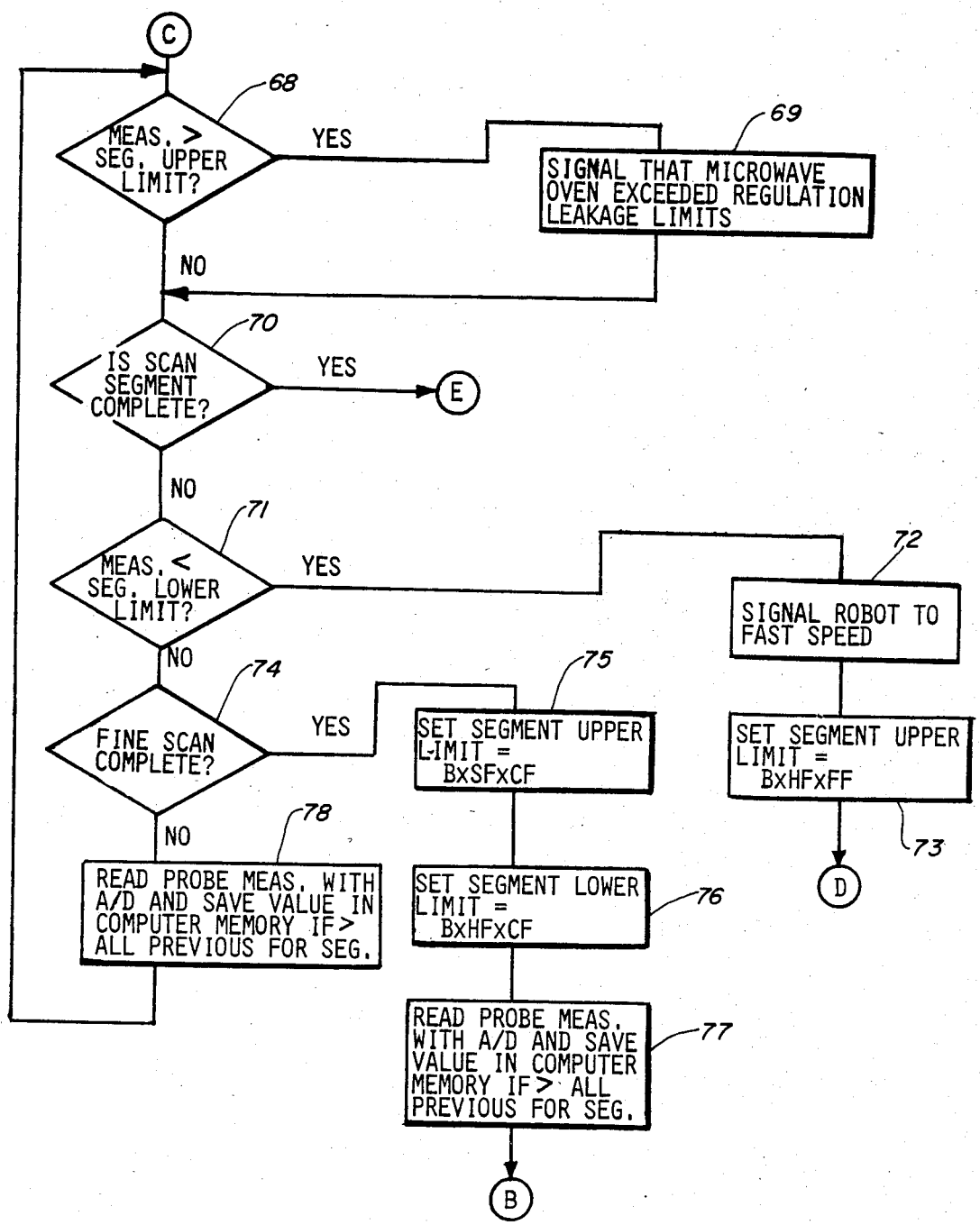

Entry from point C into the subroutine illustrated in the flow diagram of FIG. 9 is to a decisional block 68 wherein the measurement obtained from block 61 is determined to be either greater or less than the segment upper limit. If it is, the program continues to block 69 wherein a signal is provided that microwave oven exceeded the regulation leakage limits. The signal is provided to the decisional block 70 wherein a determination is made as to whether the scan segment is complete. Alternatively, if the measurement is not greater than the segment upper limit, the program continues from block 68 directly to decisional block 70.

If the scan segment is complete at decisional block 70, the program exits to point E, and if it is not, the program continues to decision block 71 wherein a determination is made as to whether the measurement is less than the segment lower limit. If the measurement is lower, then the program continues to block 72 wherein a signal is provided to the robot to return to fast speed and the program then continues to block 73 wherein the upper limit of $B \times HF \times FF$ is set. The program then exits to point D.

Where the measurement is not less than the segment lower limit, the program continues to decisional block 74 wherein a determination is made as to whether the fine scan is complete. If it is, the program continues to block 75 wherein the controller sets the segment upper limit of $B \times SF \times CF$ and sets the segment lower limit of $B \times HF \times CF$ at block 76, with the program continuing to block 77 where the computer reads the probe measurement with the analog-to-digital converter and saves the value in its memory of the measurement is greater than all previous measurements for that segment. The program then exits to point B.

If, alternatively, at decisional block 74 it is determined that the fine scan is not complete, the program continues to block 78 wherein the computer reads the probe measurement by means of the analog-to-digital converter and saves that value in its memory if that value is greater than all previous values for that segment. The program then returns back to point C to repeat the above subroutine.

Figure 10:
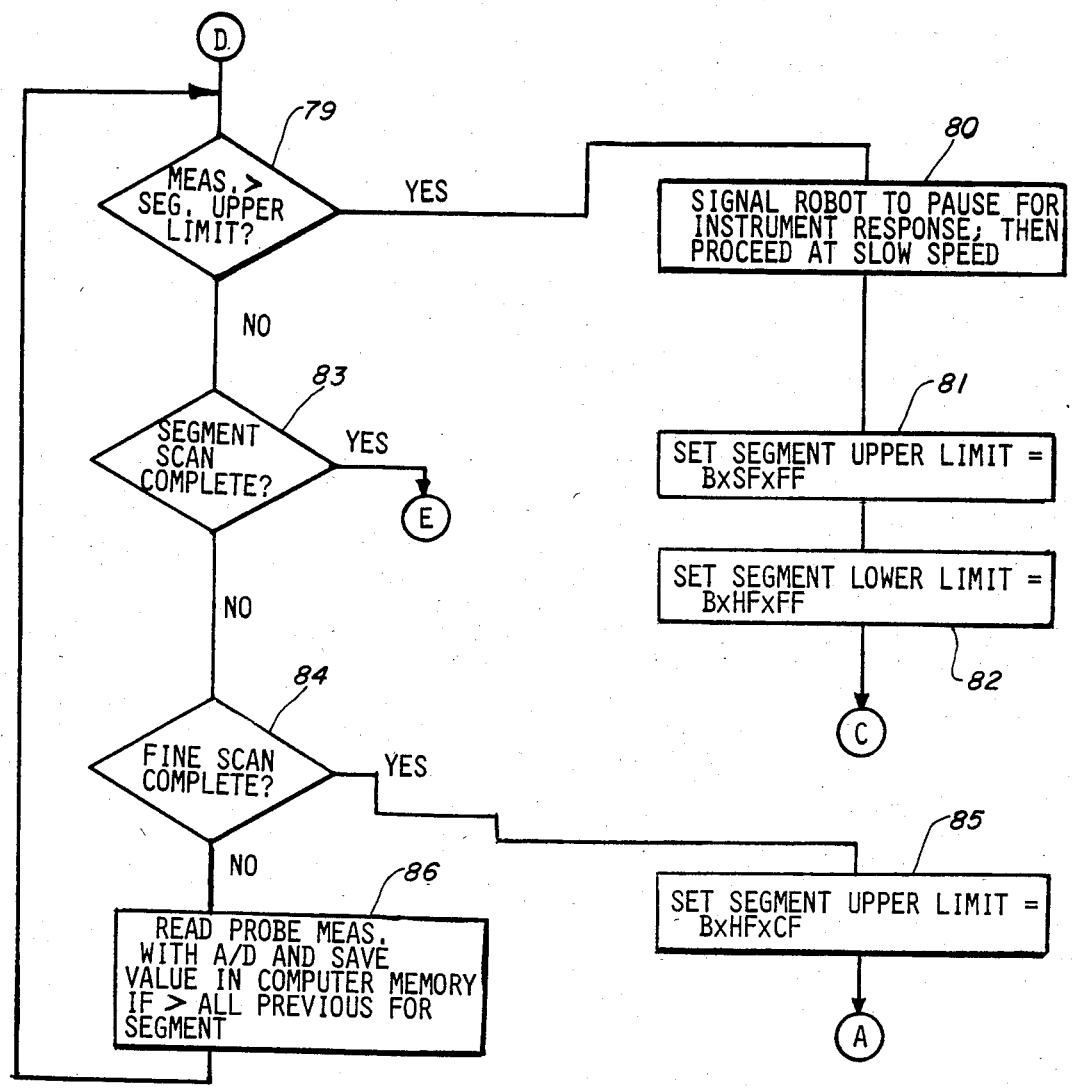

The subroutine from point D is illustrated in FIG. 10 wherein the program continues to a decisional block 79 wherein a determination is made by the computer as to whether the measurement is greater than the segment upper limit. If so, the program continues to block 80 where a signal is provided to the robot to pause for instrument response time and then to proceed at slow speed. The computer continues the program by setting the segment upper limit at $B \times SF \times FF$ and then further continues the program by setting the segment lower limit at $B \times HF \times FF$ in block 82 from which the program exits to point C.

If alternatively at decisional block 79 the measurement was determined to be not greater than the segment upper limit, the program continues to decisional block 83 where a determination is made as to whether the segment scan is complete. If so, the program exits to point E and if not, the program continues to decisional block 84 where a determination is made as to whether the fine scan is complete. If it is, the program continues to block 85 wherein the computer sets the segment upper limit at B×HF×CF and the program exits to point A. If the fine scan is not complete, the program continues to block 86 where the computer reads the probe measurement through the analog-to-digital converter and saves that value in the computer memory if that value is greater than all previous values for that segment.

The program then returns to point D and the subroutine is again repeated until the fine scan is complete and the program is caused to exit through point A.

As used herein and in the appended claims, the term "high speed" in reference to the movement speed of the sensor denotes a probe movement speed of about 4.0 or more inches per second which is in contrast to conventional test methods and apparatus which typically employ manual operation of a probe with a relatively low probe movement speed of about 1.0 inch per second.

While the illustrated preferred form of the invention employs a conventional robot for moving the probe, the invention is not limited to such a probe moving device and other probe moving means such as a human operator may be employed for moving the sensor along a preselected path adjacent a microwave energy generating device to sense energy leakage, with changes in the movement speed of the sensor being made in response to changes in the sensed energy leakage as indicated by the microcomputer controller in accord with the invention. This is with the understanding that the operator is continuously provided with the necessary information on measured radiation as the probe is moved along its path together with signals and switching devices for the operator to modify the scan speed where appropriate. However, such alternative means would provide less accuracy and a higher likelihood for error.

Thus, the invention comprehends an improved method of determining microwave leakage characteristics of a microwave oven for use in quality control of the manufacture of such ovens. The invention comprehends effecting the leakage test automatically by means of a probe moving device in the form of a robot under the control of a programmed microprocessor which provides highly accurate repeatable results and effectively speeds up the manufacture of the microwave oven, thereby providing a substantial economic advantage.

The foregoing disclosure of specific embodiments is illustrative of the broad inventive concepts comprehended by the invention.

I claim:

1. Apparatus for determining microwave leakage characteristics of a microwave oven for use in quality control of the manufacture of such ovens, comprising:
   a microwave energy sensor;
   means for moving the sensor at high speed adjacent the oven to sense microwave leakage therefrom;
   first control means for causing the moving means to move the sensor at slower speeds whenever an elevated level of leakage is sensed; and
   second control means for identifying the location of the sensed levels having a maximum leakage above a preselected amount, said second control means including reference means for comparing the sensed leakage with preselected values for acceptable leakage for said identified location, said reference values being adjusted by a factor correlated with the speed of the sensor.

2. The apparatus of claim 1 wherein said sensor comprises a plurality of probes.

3. The apparatus of claim 1 wherein said sensor comprises a plurality of spaced probes for simultaneously sensing leakage at different spaced points on said path.

4. The apparatus of claim 1 wherein said means for moving the sensor at high speed comprises means for moving the sensor along a preselected path at a speed of at least approximately 4" per second therealong.

5. The apparatus of claim 1 wherein said means for moving the sensor at high speed comprises means for moving the sensor along a preselected path at a speed of 4" per second therealong.

6. The apparatus of claim 1 wherein said means for moving the sensor at high speed includes means for moving the sensor along a preselected path including a plurality of segment scans adjacent the oven to be inspected, means for providing a signal corresponding to the microwave energy levels scanned by the sensor as it is moved at high speed along said path, and means for providing an indication whenever the level of microwave energy leakage sensed by the rapidly moving sensor at a position in said path exceeds the acceptable level thereat.

7. The apparatus of claim 1 wherein said means for moving the sensor at high speed includes means for moving the sensor along a preselected path including a plurality of segment scans adjacent the oven to be inspected, means for providing a signal corresponding to the microwave energy levels scanned by the sensor as it is moved at high speed along said path, and means for providing an indication whenever the level of microwave energy leakage sensed by the rapidly moving sensor at a position in said path exceeds the acceptable level thereat, and means for redetermining the microwave energy leakage at said position while moving the sensor at a speed lower than said high speed to provide an increased accuracy determination of the microwave leakage thereat.

8. The apparatus of claim 1 including means for causing redetermination of the sensed leakage at each such location while retraversing each such location at lower speed thereby to provide increased accuracy in the determination of leakage at each said location.

9. The apparatus of claim 1 wherein said means for moving the sensor at high speed comprises mechanism for moving the sensor rapidly along a preselected path including a plurality of segment scans at a speed of approximately 4" or more per second.

10. The apparatus of claim 9 wherein said mechanism comprises a robot and control means for automatically operating the robot to move said sensor along said path, said control means including means for changing the speed of the sensor movement by the robot in accordance with said signals produced by said sensor.

11. The apparatus of claim 1 wherein said means for moving the sensor at high speed comprises mechanism for moving the sensor rapidly along a preselected path including a plurality of segment scans at a speed of approximately 4" or more per second, means for providing a signal corresponding to the microwave energy levels scanned by the sensor as it is moved at said high speed along said path by said mechanism, means for providing a reference corresponding to acceptable levels of microwave energy leakage as sensed by the sensor as it is moved at said high speed along said path, and means for providing an indication whenever the level of microwave energy leakage sensed by the rapidly moving sensor at a position in said path exceeds the acceptable level thereat.

12. The apparatus of claim 11 wherein said mechanism comprises a robot and control means for automatically operating the robot to move said sensor along said path, said reference providing means including information storage means for storing information as to acceptable levels of leakage along said path for comparison with the actual levels sensed by said sensor to determine the operation of said control means, said control means being automatically actuated to modify said preselected path pattern and the movement speed of said sensor in response to sensing of an unacceptable high leakage level.

13. The apparatus of claim 1 wherein said means for moving the sensor at high speed comprises mechanism for moving the sensor rapidly along a preselected path including a plurality of segment scans at a speed of approximately 4" or more per second, means for providing a signal corresponding to the microwave energy levels scanned by the sensor as it is moved at said high speed along said path by said mechanism, means for providing a reference corresponding to acceptable levels of microwave energy leakage as sensed by the sensor as it is moved at said high speed along said path, means for providing an indication whenever the level of microwave energy leakage sensed by the rapidly moving sensor at a position in said path exceeds the acceptable level thereat, and means for redetermining the microwave energy leakage at said position while moving the sensor at a speed lower than said high speed to provide an increased accuracy determination of the microwave leakage thereat.

14. The apparatus of claim 13 wherein said control is arranged to cause a repeated traverse of the portion of the path at said position while causing the accuracy of the scan by the sensor to be increased during the repeated traverse by a low speed factor of approximately 0.95 where the factor is determined by the equation 1-maximum measurable error as resulting from the instrumentation time response or filtering per theoretical computation for fast or slow instrumentation field probe speed past the potential narrowest beam leakage radiation pattern generated by a given design microwave oven including variation such as that generated by a load stirrer, where the accuracy of the scan by the sensor while being moved at high speed by the robot has a corresponding high speed factor of approximately 0.30.

15. The apparatus of claim 1 wherein said means for moving the sensor at high speed comprises mechanism for moving the sensor rapidly along a preselected path including a plurality of segment scans at a speed of approximately 4" per second.

16. The apparatus of claim 1 wherein said means for moving the sensor at high speed comprises mechanism for moving the sensor rapidly along a preselected path including a plurality of segment scans at a speed of approximately 4" per second, means for providing a signal corresponding to the microwave energy levels scanned by the sensor as it is moved at said high speed along said path by said mechanism, means for providing a reference corresponding to acceptable levels of microwave energy leakage as sensed by the sensor as it is moved at said high speed along said path, and means for providing an indication whenever the level of microwave energy leakage sensed by the rapidly moving sensor at a position in said path exceeds the acceptable level thereat.

17. The apparatus of claim 1 wherein said means for moving the sensor at high speed comprises mechanism for moving the sensor rapidly along a preselected path including a plurality of segment scans at a speed of approximately 4" per second, means for providing a signal corresponding to the microwave energy levels scanned by the sensor as it is moved at said high speed along said path by said mechanism, means for providing a reference corresponding to acceptable levels of microwave energy leakage as sensed by the sensor as it is moved at said high speed along said path, means for providing an indication whenever the level of microwave energy leakage sensed by the rapidly moving sensor at a position in said path exceeds the acceptable level thereat, and means for redetermining the microwave energy leakage at said position while moving the sensor at a speed lower than said high speed to provide an increased accuracy determination of the microwave leakage thereat.

18. The apparatus of claim 1 wherein said means for moving the sensor comprises a robot.

19. The apparatus of claim 1 wherein said means for moving the sensor comprises means for accurately spacing the sensor from the oven while moving the sensor.

20. The apparatus of claim 1 wherein said moving means is caused to effect a repeated traverse of each location whereat said maximum leakage is sensed.

21. The apparatus of claim 1 wherein said moving means is caused to effect a repeated traverse of each location whereat said maximum leakage is sensed while causing the accuracy of the scan by the sensor to be increased during the repeated traverse.

22. The apparatus of claim 1 wherein said moving means is caused to effect a repeated traverse of each location whereat said maximum leakage is sensed while causing the accuracy of the scan by the sensor to be increased during the repeated traverse to a fine segment factor of approximately 0.98 wherein the factor is determined by the equation 1-maximum measurement error which could result from peak leakage along a specific scan being less than the true maximum were it to be located somewhere between scans as theoretically computed for different distances between such scans for potential leakage radiation patterns for a given microwave oven design.

23. The apparatus of claim 1 wherein said moving means is caused to effect a repeated traverse of each location whereat said maximum leakage is sensed while causing the accuracy of the scan by the sensor to be increased during the repeated traverse to a fine segment factor of approximately 0.98 wherein the factor is determined by the equation 1-maximum measurement error which could result from peak leakage along a specific scan being less than the true maximum were it to be located somewhere between scans as theoretically computed for different distances between such scans for potential leakage radiation patterns for a given microwave oven design, where the accuracy of the scan by the sensor while being moved at high speed by the robot has a corresponding coarse segment factor of between approximately 0.7 to 0.9.

24. The apparatus of claim 1 wherein said moving means is caused to effect a repeated traverse of each location whereat said maximum leakage is sensed while causing the accuracy of the scan by the sensor to be increased during the repeated traverse by a low speed factor of approximately 0.95 where the factor is determined by the equation 1-maximum measurable error as resulting from the instrumentation time response or filtering per theoretical computation for fast or slow instrumentation field probe speed past the potential narrowest beam leakage radiation pattern generated by a given design microwave oven including variation such as that generated by a microwave mode stirrer.

25. The apparatus of claim 1 wherein said second control means includes means for adjusting the control to compensate for an approximately 15% instrumentation error in determining the exceeding of said acceptable leakage.

26. The inspection method of determining the microwave leakage characteristic of a microwave oven having means for causing a time variable delivery of microwave energy to portions of the oven wherein such leakage may occur while said inspection method is being carried out in quality control of the manufacture of such ovens, comprising the steps of:
   providing a microwave energy sensor;
   providing mechanism for moving the sensor at a high speed of approximately 4" per second along a preselected path adjacent the oven to be inspected;
   providing a signal corresponding to the microwave energy levels sensed by the sensor as it is moved along said path;
   providing a reference corresponding to acceptable levels of microwave energy leakage as sensed by the sensor as it is moved at said high speed along said path;
   providing a high leakage level indicating signal whenever the level of microwave energy leakage sensed by the rapidly moving sensor at a position in said path is at a high leakage level which exceeds the acceptable level thereat;
   automatically controlling the sensor to reduce the sensor movement speed in response to said high leakage level signal;
   redetermining the microwave energy leakage at said position while moving the sensor at a speed sufficiently lower than said high speed, to average out any time variations in the delivery of the microwave energy to said position, and while moving the sensor along said preselected path pattern which assures the accuracy of determination of the microwave energy leakage level thereat;
   automatically controlling the movement of said sensor in accordance with the signal corresponding to the sensed microwave energy level to recommence high speed sensor movement when the sensed leakage level is acceptable; and
   providing data relative to sensed high leakage level values and positions thereof along said path for use in effecting subsequent corrective actions as required.

27. The inspection method of determining the microwave leakage characteristics of claim 26 including the step of insulating the mechanism adjacent the sensor against pickup of ambient microwave energy for causing the sensed microwave energy level to accurately correspond to that along said path.

28. The method of determining excessive microwave radiation leakage of claim 26 wherein the sensor is caused to repeat traverse of the portion of the path at said position while causing the accuracy of the scan by the sensor to be increased during the repeated traverse to a fine segment factor of approximately 0.98 wherein the factor is determined by the equation 1-maximum measurement error which could result from peak leakage along a specific scan being less than the true maximum were it to be located somewhere between scans as theoretically computed for different distances between such scans for potential leakage radiation patterns for a given microwave oven design.

29. The inspection method of claim 26 further including the steps of providing a spacer in association with said sensor, and causing the spacer to be moved by said mechanism against the surface of the microwave oven along said path to maintain the sensor accurately spaced from the oven surface along said path.

30. The inspection method of claim 26 wherein said reference defines error limits at each position within which the sensed level is acceptable.

31. The inspection method of claim 26 wherein said oven includes a window having a transverse radiation blocking means and said path includes a portion extending along the edge of the window for detecting leakage at the edge of the blocking means and window.

32. The inspection method of claim 26 wherein the determination of the leakage level being sensed during high speed movement of the sensor is a coarse determination and the determination of the maximum leakage level being sensed during reduced speed movement of the sensor is a fine determination.

33. The inspection method of claim 26 wherein the determination of the leakage level being sensed during high speed movement of the sensor is a coarse determination, the determination of the leakage during an initial portion of the reduced speed operation is a coarse determination, and the determination of the maximum leakage level being sensed during reduced speed movement of the sensor is a fine determination.

34. The inspection method of claim 26 wherein the determination of the leakage level being sensed during high speed movement of the sensor is a coarse determination, the determination of the leakage during an initial portion of the reduced speed operation is a coarse determination, the determination of the maximum leakage level being sensed during reduced speed movement of the sensor is a fine determination, and the determination of the leakage at the end of said reduced speed operation is a coarse determination.

35. The inspection method of claim 26 wherein said step of moving the sensor comprises a step of causing a programmed movement of the sensor, and said sequence of speed reducing and maximum leakage determining steps is effected automatically during said movement.

36. The inspection method of claim 26 wherein the date providing step is effected upon completion of the movement along said path and data concerning each said maximum leakage determination is provided.

* * * * *